(12) United States Patent
Yamamoto

(10) Patent No.: US 9,373,389 B2
(45) Date of Patent: Jun. 21, 2016

(54) SEMICONDUCTOR MEMORY DEVICE

(71) Applicant: SOCIONEXT INC., Kanagawa (JP)

(72) Inventor: Yasue Yamamoto, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/989,753

(22) Filed: Jan. 6, 2016

(65) Prior Publication Data

US 2016/0118108 A1 Apr. 28, 2016

Related U.S. Application Data

(63) Continuation of application No. PCT/JP2014/003099, filed on Jun. 10, 2014.

(30) Foreign Application Priority Data

Jul. 2, 2013 (JP) .................................. 2013-138953

(51) Int. Cl.
*G11C 11/00* (2006.01)
*G11C 11/419* (2006.01)

(52) U.S. Cl.
CPC .................................... *G11C 11/419* (2013.01)

(58) Field of Classification Search
CPC ........................................................ G11C 11/00
USPC .................................................. 365/129–188
See application file for complete search history.

(56) References Cited

U.S. PATENT DOCUMENTS

| 5,493,536 | A | | 2/1996 | Aoki | |
|---|---|---|---|---|---|
| 5,646,885 | A | * | 7/1997 | Matsuo | G11C 11/412 365/154 |
| 6,215,694 | B1 | | 4/2001 | Li et al. | |
| 7,164,596 | B1 | * | 1/2007 | Deng | G11C 11/419 365/154 |
| 7,430,134 | B2 | * | 9/2008 | Takeyama | G11C 11/412 365/154 |
| 7,545,693 | B2 | * | 6/2009 | Toda | G11C 16/26 365/154 |
| 7,586,780 | B2 | * | 9/2009 | Suzuki | G11C 11/413 365/154 |
| 2007/0025162 | A1 | * | 2/2007 | Deng | G11C 11/419 365/189.09 |
| 2008/0151604 | A1 | * | 6/2008 | Suzuki | G11C 11/413 365/154 |

FOREIGN PATENT DOCUMENTS

| JP | 63-205890 A | 8/1988 |
|---|---|---|
| JP | 07-057469 A | 3/1995 |
| WO | 00/74066 A1 | 12/2000 |

OTHER PUBLICATIONS

T. Suzuki, et al., "A Stable 2-Port SRAM Cell Design Against Simultaneously Read/Write-Disturbed Accesses," IEEE Journal of ISolid-State Circuits, Sep. 2008, vol. 43, No. 9, pp. 2109-2119.
International Search Report dated Aug. 5, 2014 issued in International Patent Application No. PCT/JP2014/003099 (English translation).

* cited by examiner

*Primary Examiner* — Harry W Byrne
(74) *Attorney, Agent, or Firm* — McDermott Will & Emery LLP

(57) ABSTRACT

A semiconductor memory device having a memory cell array in which a plurality of memory cells are arranged in columns and rows to form a matrix pattern includes read word lines, read bit lines, and read source lines. Each of the plurality of memory cells includes: first and second inverters which are cross-coupled to each other; a first transistor which is connected between a read bit line and a read source line and of which the gate is connected to the output terminal of the first inverter; and a second transistor which is connected in series to the first transistor and of which the gate is connected to a read word line.

11 Claims, 16 Drawing Sheets

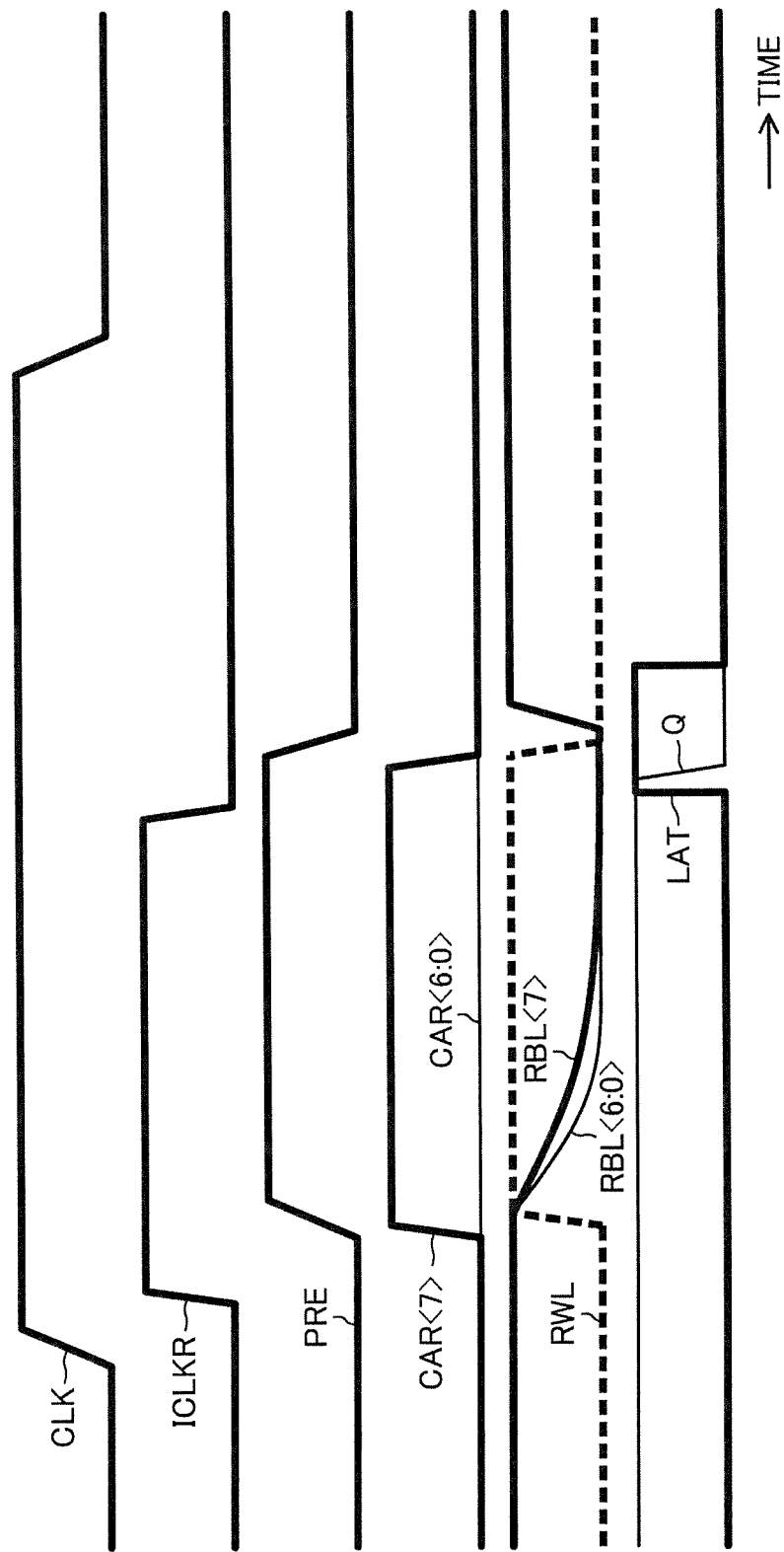

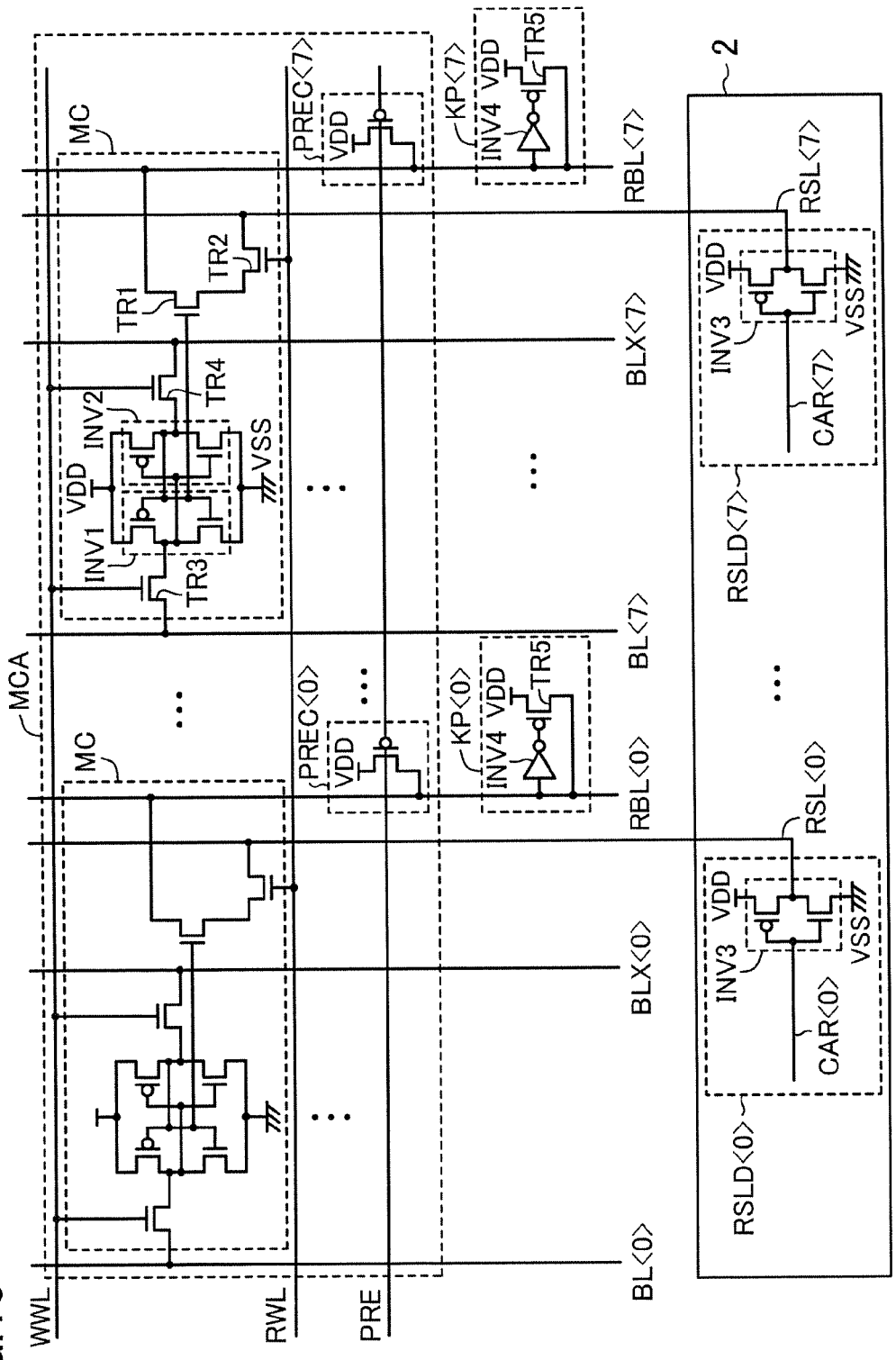

SEMICONDUCTOR MEMORY DEVICE

CROSS-REFERENCE TO RELATED APPLICATION

This is a continuation of International Application No. PCT/JP2014/003099 filed on Jun. 10, 2014, which claims priority to Japanese Patent Application No. 2013-138953 filed on Jul. 2, 2013. The entire disclosures of these applications are hereby incorporated by reference.

BACKGROUND

The present disclosure relates to a semiconductor memory device, and more particularly relates to a technique for cutting down the power dissipation of an SRAM (static random access memory).

As mobile electronic devices have become more and more popular in recent years, there have been increasing demands for reducing the power dissipation of semiconductor integrated circuits. Particularly in an ultralarge-scale semiconductor integrated circuit called "system LSI (large-scale integrated circuit)," an on-chip SRAM accounts for so large a percentage of the entire circuit that reducing the power dissipation of the SRAM will reduce the overall power dissipation of the entire system LSI chip effectively.

As a conventional SRAM, disclosed is a single-ended eight-transistor (8T)-SRAM by, for example, Toshikazu Suzuki et al. in "A Stable 2-Port SRAM Cell Design against Simultaneously Read/Write-Disturbed Accesses," IEEE JOURNAL OF SOLID-STATE CIRCUITS, September 2008, Vol. 43, No. 9, pp. 2109-2119.

FIG. 17 illustrates a configuration for a memory cell of an SRAM according to known art. In this memory cell 101, data is written by controlling a write word line WWL, a write bit line BL and an inverted write bit line BLX, and data is read by controlling a read word line RWL and a read bit line RBL.

While data is being read, the read bit line RBL is precharged, and the read word line RWL is driven to turn a transistor T2 ON. After that, when a transistor T1 turns ON, for example, depending on the data stored in this memory cell 101, the read bit line RBL is connected to a ground potential. As a result, the data requested is read out.

In general, an SRAM is comprised of a plurality of memory cells 101 that are arranged in columns and rows to form a matrix pattern, and each read word line RWL is connected to an associated row of memory cells including a selected memory cell. Thus, in an SRAM comprised of memory cells 101 each having the configuration shown in FIG. 17, when a read word line RWL is driven, the transistors T1 and T2 may both turn ON in each of a plurality of memory cells connected to that read word line RWL. In that case, in an SRAM comprised of memory cells 101 each having the configuration shown in FIG. 17, no matter whether a given memory cell is a selected memory cell or a non-selected one, the read bit line RBL connected to those memory cells may be discharged to the ground potential.

As a result, in every data read cycle, the read bit lines RBL connected to non-selected memory cells need to be discharged and precharged, thus possibly increasing the power dissipation. Particularly when the number of memory cells increases, the power dissipation rises significantly.

In view of the foregoing background, it is therefore an object of the present disclosure to provide a semiconductor memory device which allows for cutting down the power dissipation even if the number of memory cells increases.

SUMMARY

To overcome those problems, according to the present disclosure, the following measures are taken. Specifically, the present disclosure provides a semiconductor memory device having a memory cell array in which a plurality of memory cells are arranged in columns and rows to form a matrix pattern. The memory device includes: a plurality of read word lines, each of which is provided for an associated one of the rows of the memory cell array and connected in common to a plurality of memory cells that form the associated row; a plurality of read bit lines, each of which is provided for an associated one of the columns of the memory cell array and connected in common to a plurality of memory cells that form the associated column; and a plurality of read source lines, each of which is provided for an associated one of the columns of the memory cell array and connected in common to a plurality of memory cells that form the associated column. Each of the plurality of memory cells includes: first and second inverters which are cross-coupled to each other, a first transistor which is connected between a read bit line and a read source line that are associated with the memory cell and of which the gate is connected to the output terminal of the first inverter, and a second transistor which is connected in series to the first transistor and of which the gate is connected to a read word line that is associated with the memory cell.

According to this configuration, each memory cell includes a latch circuit comprised of first and second inverters and having the ability to hold data. Each memory cell further includes first and second transistors which are connected in series together between a read bit line and a read source line that are associated with the memory cell itself. The first transistor has its gate connected to the first inverter, while the second transistor has its gate connected to its associated read word line.

In addition, by controlling a read word line associated with each row of the memory cell array and a read bit line and a read source line associated with each column of the memory cell array, data is readable from a selected memory cell.

Specifically, while data is being read from a selected memory cell, each precharged read bit line is turned into a floating one and the read source line connected to the selected memory cell is discharged. In addition, the read word line connected to the selected memory cell is also driven. As a result, the second transistor turns ON in each of the selected memory cell and the other non-selected memory cells that are arranged on the same row as the selected one. Meanwhile, the first transistor in each of memory cells on a plurality of columns turns either ON or OFF in accordance with the data stored in that memory cell.

In this case, if the first transistor turns ON in each of the memory cells that are connected to the read word line driven, the read bit line, first and second transistors, and read source line that are associated with each of the selected and non-selected memory cells are connected together. That is to say, a current path to connect the read bit line and read source line together may be formed.

This semiconductor memory device can control the respective read source lines independently of each other. Thus, the device can perform a control operation such that while a read source line connected to a selected memory cell is discharged, a potential on read source lines connected to the other non-selected memory cells is kept approximately as high as the potential on the read bit line, for example.

Thus, current flows through a current path that passes through the selected memory cell, so that data is readable from the selected memory cell. On the other hand, no current flows through a current path that passes through any of the non-selected memory cells. That is to say, even if the number of memory cells arranged in the memory cell array increases, the amount of current to flow while data is being read may be no greater than the amount of current flowing through the selected memory cell. This thus allows for cutting down the overall power dissipation of the entire semiconductor memory device.

The present disclosure provides a semiconductor memory device which allows for cutting down the power dissipation even if the number of memory cells provided increases.

BRIEF DESCRIPTION OF THE DRAWINGS

FIG. 6 is a waveform chart illustrating how to read data from the conventional memory cell.

FIG. 10 illustrates a configuration for a semiconductor memory device according to a second embodiment.

DETAILED DESCRIPTION

First Embodiment

Figure 1:
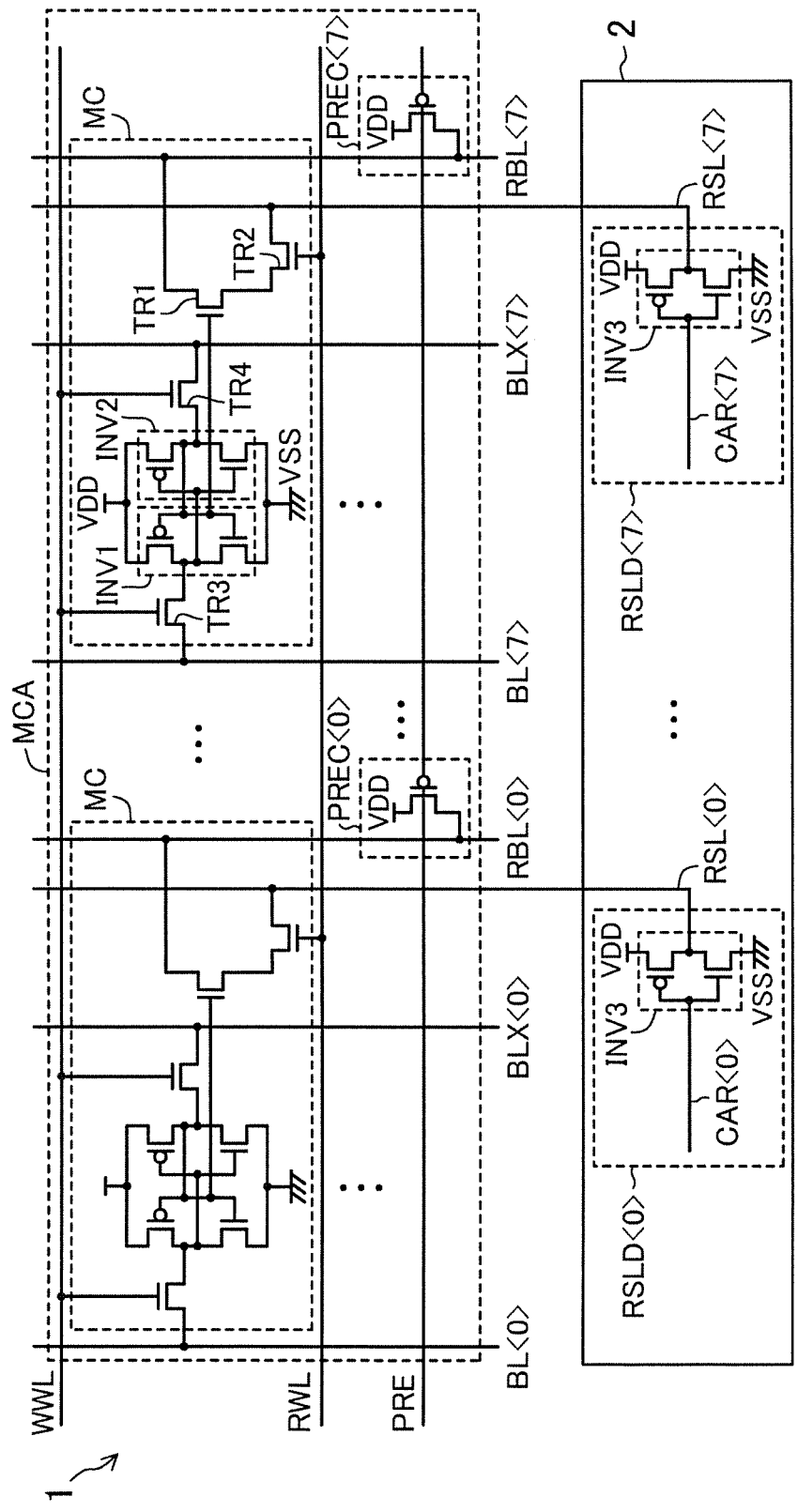
FIG. 1 illustrates a configuration for a semiconductor memory device according to a first embodiment.

FIG. 1 illustrates a configuration for a semiconductor memory device according to a first embodiment. The semiconductor memory device 1 shown in FIG. 1 includes a memory cell array MCA and a read source line driver section 2. The semiconductor memory device 1 may be implemented as a single-ended, eight-transistor (8T) SRAM, for example.

The memory cell array MCA includes memory cells MC, write bit lines BL <7:0>, inverted write bit lines BLX <7:0>, a write word line WWL, a read word line RWL, read bit lines RBL <7:0>, precharge circuits PREC <7:0>, a precharge signal PRE and read source lines RSL <7:0>.

Note that this memory cell array MCA has a configuration when the number of columns of the read word line RWL is eight. In this embodiment, this entire configuration will be handled as one bit. Specifically, the memory cell array MCA illustrated in FIG. 1 has an exemplary configuration in a situation where 1 bit=64 Rows×8 Columns (Column <7:0>). In the following description of embodiments, the subscript <7:0> indicating that there are multiple elements of the same type may be sometimes omitted as appropriate, and the read source lines RSL <7:0> may be sometimes simply referred to herein as "read source lines RSL".

The memory cells MC are each configured as an 8T-SRAM memory cell, and are arranged in columns and rows. Specifically, each of these memory cells MC includes two inverters INV1 and INV2 forming a latch to hold data, two transistors TR3 and TR4 forming a write port to write data on the latch, and two more transistors TR1 and TR2 forming a read port to read data out. The inverters INV1 and INV2 may operate with a supply voltage VDD. The transistors TR1-TR4 may be configured as NMOS (negative-channel metal oxide semiconductor) transistors, for example.

The respective input terminals of the inverters INV1 and INV2 are connected together, so are the respective output terminals thereof. The inverter INV1 has its input terminal connected to the drain of the transistor TR3 and has its output terminal connected to the gate of the transistor TR1. The inverter INV2 has its input terminal connected to the drain of the transistor TR4.

Also, the source of the transistor TR1 and the drain of the transistor TR2 are connected together between their associated read bit line RBL and read source line RSL.

Each of the write bit lines BL is arranged to be provided for an associated one of the columns of the memory cell array MCA, and is connected in common to the respective sources of the transistors TR3 included in the associated column of memory cells MC. Each of the inverted write bit lines BLX and an associated one of the write bit lines BL form a pair. Each inverted write bit line BLX is arranged to be provided for an associated one of the columns of the memory cell array MCA, and is connected in common to the respective sources of the transistors TR4 included in the associated column of memory cells MC.

Each of the write word lines WWL is arranged to be provided for an associated one of the rows of the memory cell array MCA, and is connected in common to the respective gates of the transistors TR3 and TR4 included in the associated row of memory cells MC.

Each of the read word lines RWL is arranged to be provided for an associated one of the rows of the memory cell array MCA, and is connected in common to the respective gates of the transistors TR2 included in the associated row of memory cells MC.

Each of the read bit lines RBL is arranged to be provided for an associated one of the columns of the memory cell array MCA, and is connected in common to the respective drains of the transistors TR1 included in the associated column of memory cells MC.

Each of the read source lines RSL is arranged to be provided for an associated one of the columns of the memory cell array MCA, and is connected in common to the respective sources of the transistors TR2 included in the associated column of memory cells MC.

Each of the precharge circuits PREC is configured as a PMOS (positive-channel MOS) transistor, for example, and is arranged to be provided for an associated one of the read bit lines RBL. In response to the precharge signal PRE, each precharge circuit PREC precharges its associated read bit line RBL to a predetermined potential level, e.g., a power supply potential VDD. The precharge signal PRE is applied in common to the respective gates of the precharge circuits PREC (PMOS transistors).

The read source line driver section 2 includes a plurality of read source line drivers RSLD <7:0> associated respectively with the plurality of source lines RSL.

Each of the read source line drivers RSLD is configured as an inverter INV3 operating with the power supply potential VDD, for example. Each read source line driver RSLD drives, responsive to its associated column select signal CAR <7:0>, its associated read source line RSL to either the power supply potential VDD or a ground potential. More specifically, during a data read operation, in response to an activated one (e.g., a selected column signal CAR <7>) of the column select signals CAR <7:0>, one read source line RSL (such as the read source line RSL <7>) is connected to the ground potential VSS. In this case, the selected column signal CAR is generated when an address signal is decoded, and is a signal indicating what column is now selected in the memory cell array MCA.

As can be seen, the single-ended 8T-SRAM macro according to this embodiment is configured as a column source decoding type which can read data by controlling a read word line RWL and a read source line RSL that are connected to the read port.

Figure 2:
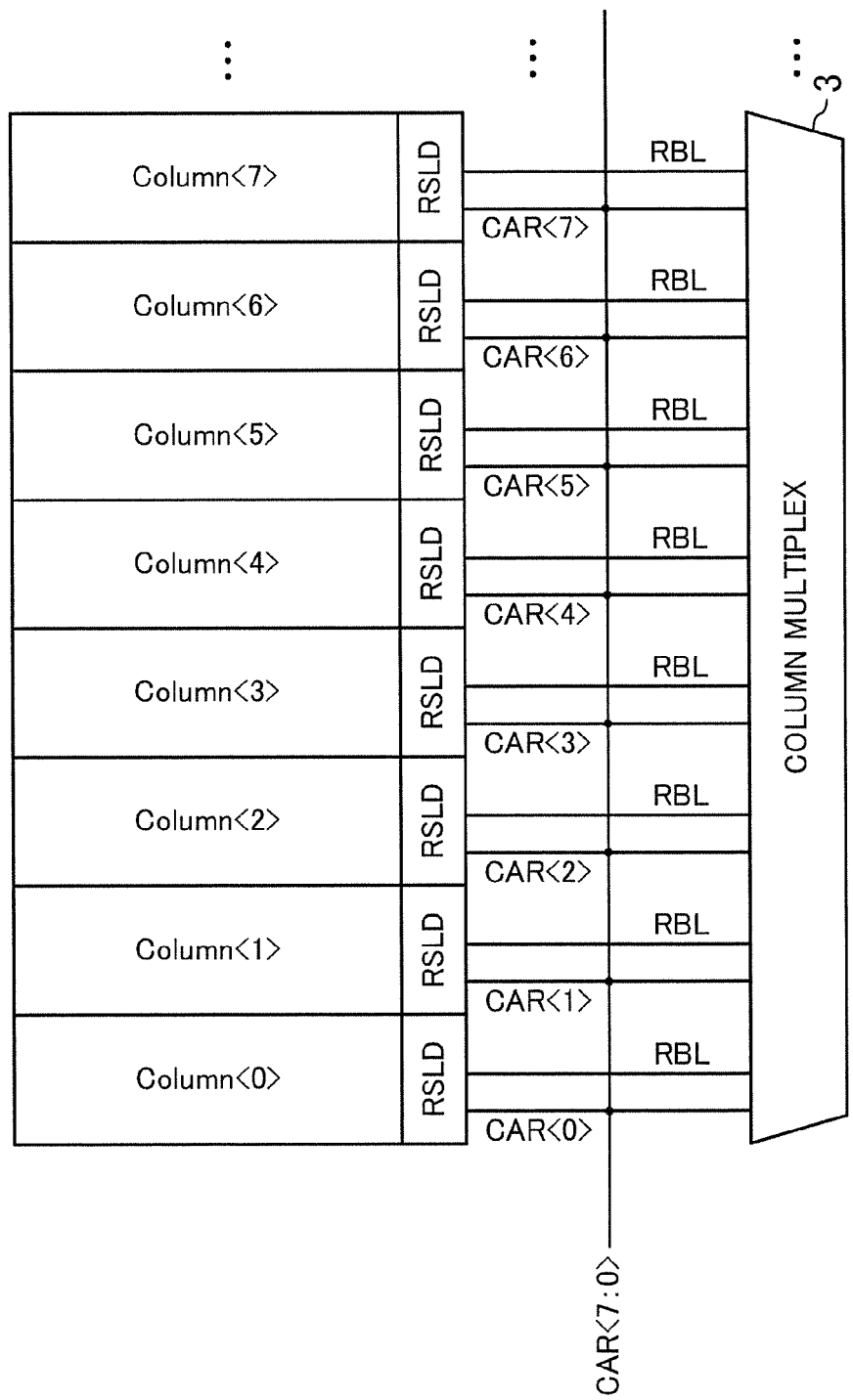
FIG. 2 generally illustrates a column multiplex configuration for the semiconductor memory device shown in FIG. 1.

FIG. 2 generally illustrates a column multiplex configuration for the semiconductor memory device shown in FIG. 1. In response to a column select signal CAR <7:0>, the column multiplex 3 selects a read bit line RBL associated with one of the respective Columns <7:0> of the memory cell array MCA, and outputs its potential. In this embodiment, the configuration illustrated in FIG. 2 is defined to be one bit.

Next, it will be described how the semiconductor memory device 1 of this embodiment performs a read operation.

Figure 3:
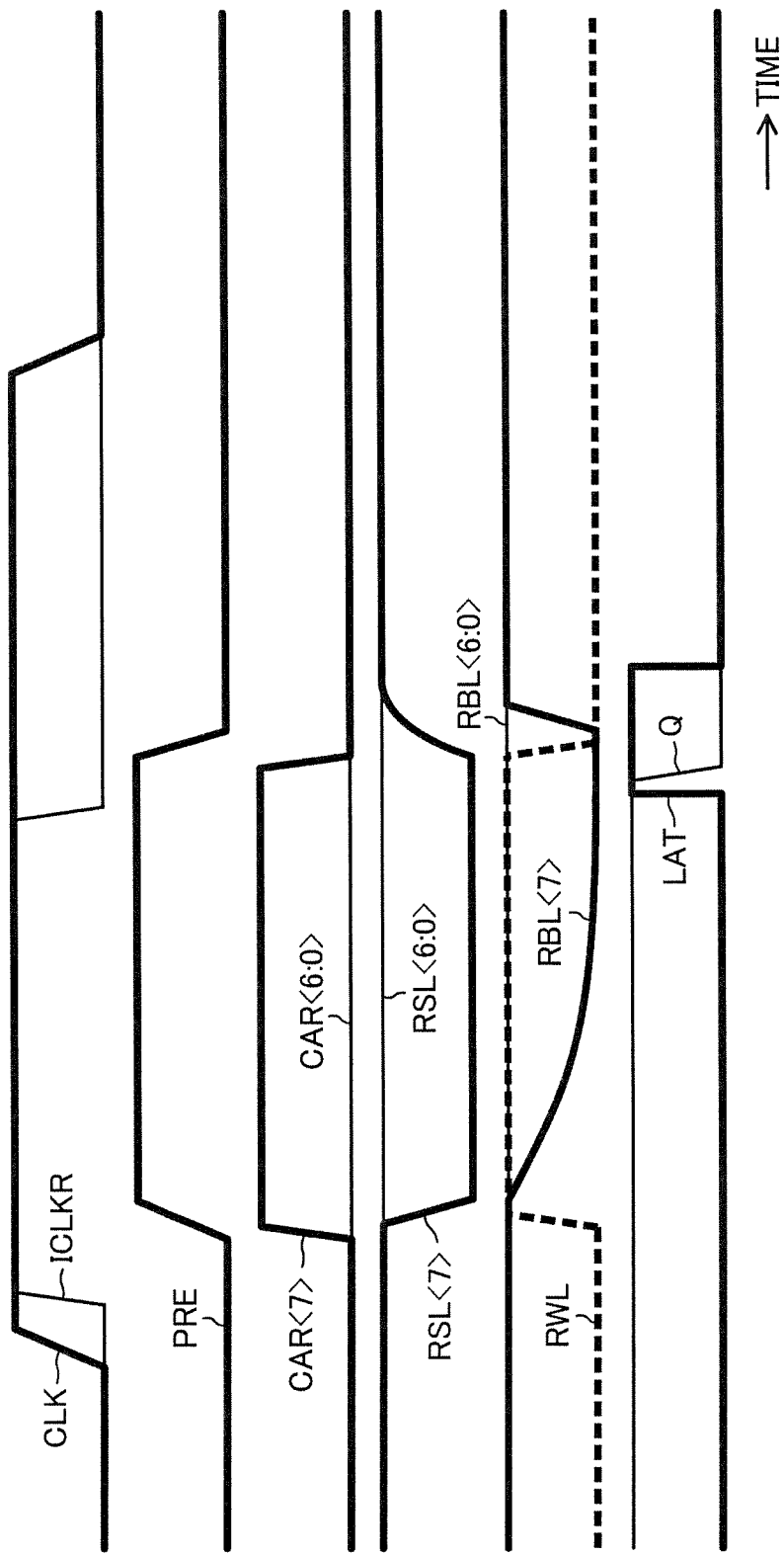
FIG. 3 is a waveform chart illustrating how the semiconductor memory device of the first embodiment performs a read operation.

FIG. 3 is a waveform chart illustrating how the semiconductor memory device of the first embodiment performs a read operation. Specifically, the waveform chart illustrated in FIG. 3 shows a situation where the selected column is Column <7> and the power supply potential VDD is 0.6 V in an 8T-SRAM macro comprised of 64 Rows×8 Columns×4 bits.

Before a data read operation is started, both the precharge signal PRE and the column select signal CAR are at L level, and therefore, the read source line RSL and the read bit line RBL are both precharged to the same potential level, i.e., the power supply potential VDD.

When an external clock signal CLK is input to the semiconductor memory device 1, an internal clock signal ICLKR is generated inside the device 1. Thereafter, when the precharge signal PRE rises to H level in response to the internal clock signal ICLKR, the read bit line RBL stops being precharged and turns into a floating one.

Also, when the precharge signal PRE rises to the H level, the selected column signal CAR <7> among the column select signals CAR <7:0> is activated to the H level. When the selected column signal CAR <7> rises to the H level, the read source line RSL <7> that has been precharged to the power supply potential VDD is discharged by the read source line driver RSLD <7>.

At this time, when the read word line RWL is driven to the H level, the charge on the read bit line RBL <7> associated with Column <7> is discharged in accordance with the data stored in the memory cell MC. Then, the amplitude of the read bit line RBL <7> is amplified by a single-ended amplifier provided at the end of the line, for example. When a latch pulse signal LAT is input at an appropriate timing to a latch circuit connected to follow the single-ended amplifier, the amplified signal that has been read out from the memory cell MC is provided as Q output. Thereafter, the precharge signal PRE and the selected column signal CAR <7> fall to the L level, when the read bit line RBL <7> and the read source line RSL <7> are precharged. In this manner, a read operation is performed.

In this case, during the read operation, each of the column select signals CAR <6:0> associated with the non-selected Columns <6:0> other than the selected column remains L. Thus, the read source lines RSL <6:0> associated with those Columns <6:0> are still maintained at the same power supply potential VDD as their associated read bit lines RBL <6:0>.

Therefore, in the memory cell MCs on the non-selected columns among the memory cells MC connected to the selected read word line RWL, the non-selected read bit lines RBL <6:0> are not discharged, irrespective of the data stored there.

That is to say, the power dissipated by such an SRAM macro can be no greater than what has been used to discharge and precharge the read bit line RBL and read source line RSL associated with the selected column. This thus allows for cutting down the power dissipation.

Next, the effects to be achieved by this embodiment will be described in comparison with the known art.

Figure 4:
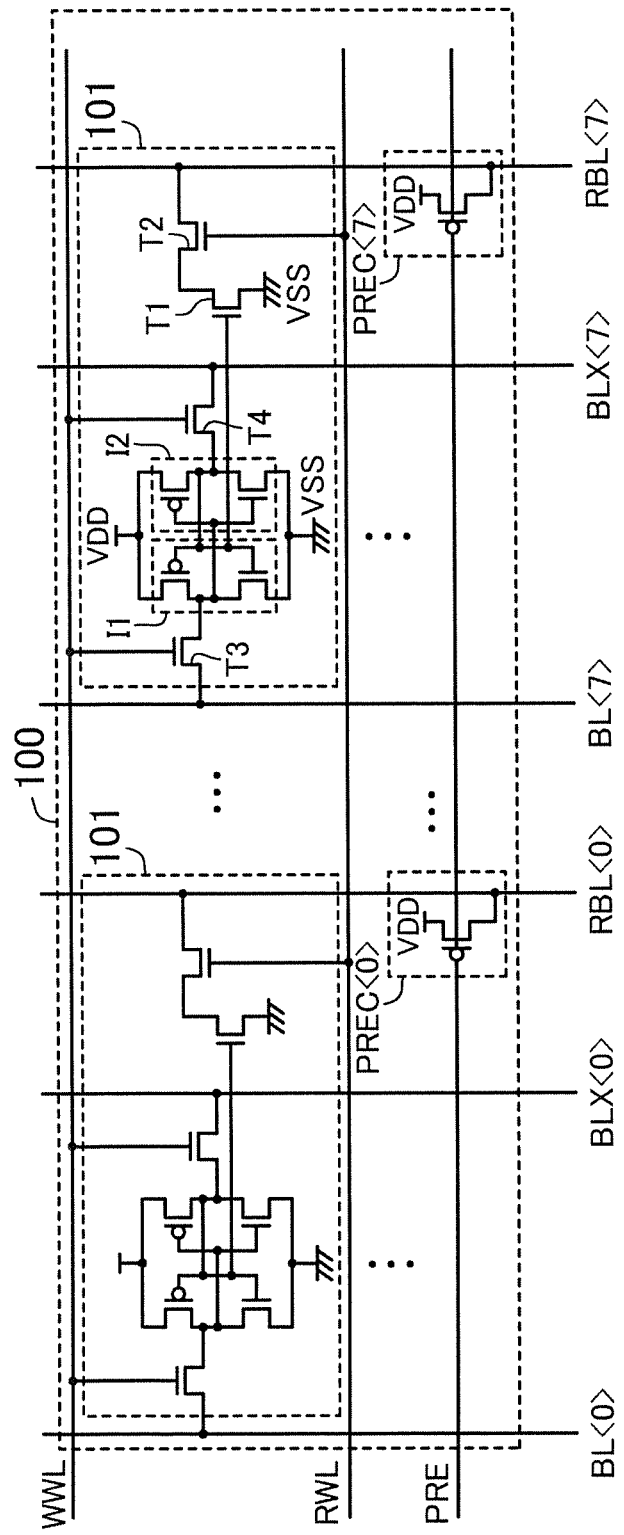
FIG. 4 illustrates a reference example of which the memory cell array is comprised of conventional memory cells.
Figure 17:
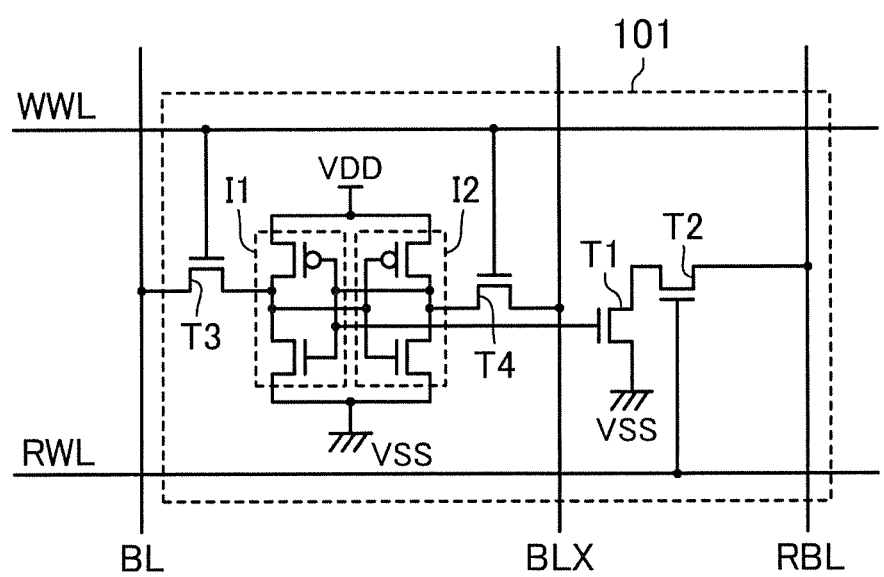
FIG. 17 illustrates a configuration for a memory cell of an SRAM according to known art.

FIG. 4 illustrates a reference example of which the memory cell array is comprised of the memory cells shown in FIG. 17. In the memory cell array 100 shown in FIG. 4, each memory cell 101 includes transistors T1 and T2 forming a read port, transistors T3 and T4 forming a write port, and inverters I1 and I2 forming a latch. This memory cell 101 includes transistors T1 and T2 which are connected in series together between the read bit line RBL and the ground potential VSS, which is a difference from the memory cell MC according to this embodiment.

Figure 5:
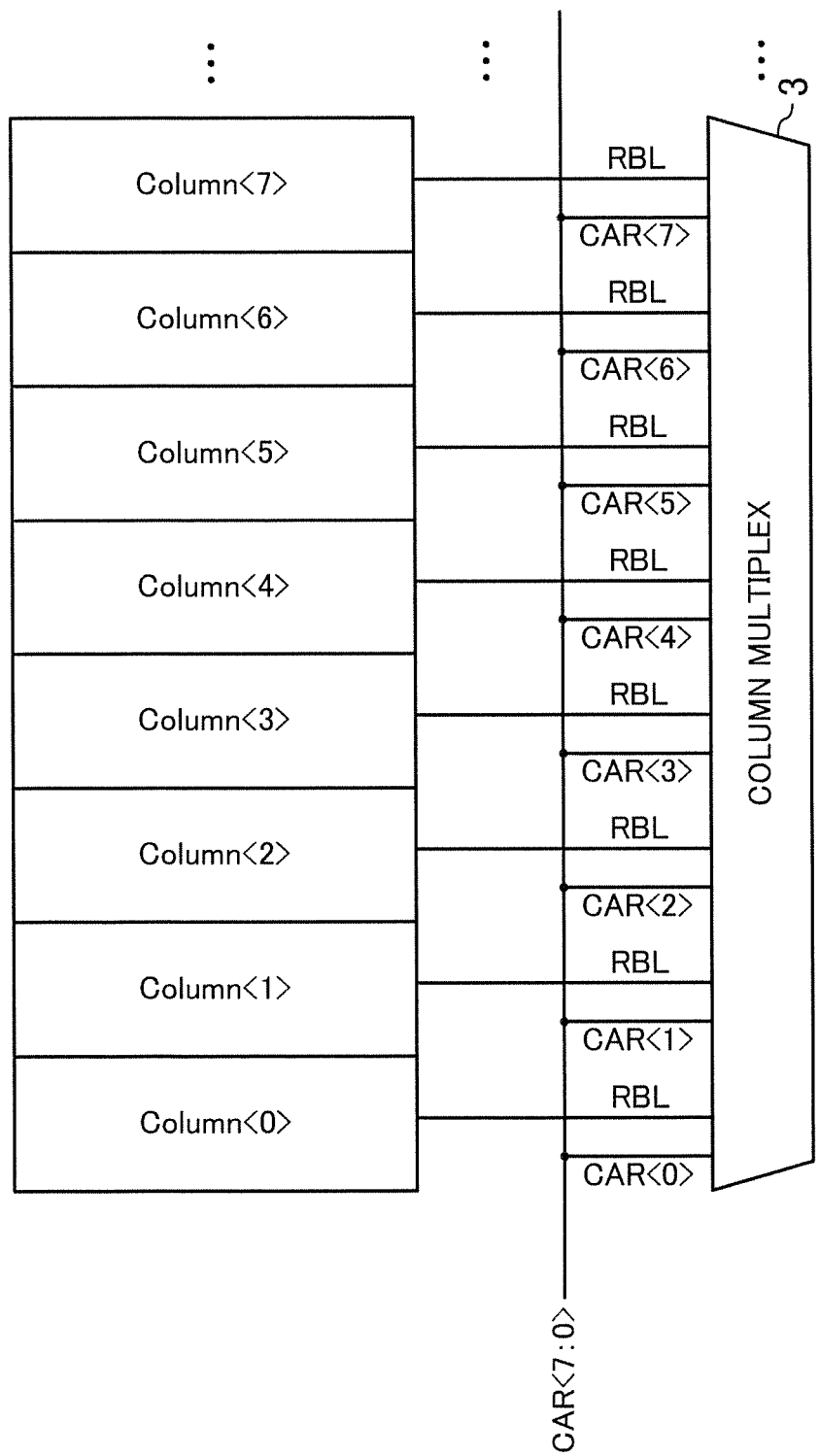
FIG. 5 generally illustrates a reference example of a column multiplex configuration including the memory cell array shown in FIG. 4.

FIG. 5 generally illustrates a reference example of a column multiplex configuration including the memory cell array shown in FIG. 4. In FIG. 5, in response to a column select signal CAR <7:0>, the column multiplex 3 selects one of the read bit lines RBL <7:0>.

FIG. 6 is a waveform chart illustrating how to read data from the memory cell shown in FIG. 4. Specifically, the waveform chart illustrated in FIG. 6 shows a situation where the selected column is Column <7> and the power supply potential VDD is 0.6 V in an 8T-SRAM macro comprised of 64 Rows×8 Columns×4 bits.

A major difference of the example shown in FIG. 6 from the one shown in FIG. 3 will be described.

When the selected column signal CAR <7> rises to the H level, the read word line RWL is driven to the H level. Then, the read bit line RBL <7> that has been precharged to the power supply potential VDD is discharged in accordance with the data stored in the memory cell 101. At this time, the column select signal CAR <6:0> is at the L level, but the read bit lines RBL <6:0> are connected to the ground potential VSS through the transistors T1 and T2 in accordance with the data stored in the memory cells 101. In FIG. 6, data at the H level is supposed to be stored in the memory cells 101.

As can be seen, according to the known art, when data is read from the selected memory cell 101, not only the read bit line RBL <7> associated with the selected Column <7> including the selected memory cell 101 but also the read bit lines RBL <6:0> associated with the non-selected Columns <6:0> including the non-selected memory cells 101 have their charges discharged. When the precharge signal PRE falls to the L level after that, the read bit lines RBL <7:0> that have been discharged are precharged.

That is to say, according to the known art, in every cycle of the read operation, the read bit line RBL associated with a single selected column and the read bit lines RBL associated with the plurality of non-selected columns are discharged and precharged. As a result, the power is dissipated in vain. Particularly, as the number of memory cells connected to each read bit line RBL increases, the overall capacitance of the read bit line RBL increases, so does the power dissipated by charging and discharging the read bit line RBL. Therefore, according to the known configuration, the larger the number of I/O bits, the greater the power dissipation.

In contrast, according to this embodiment, the power needs to be dissipated for discharging and precharging only a single read bit line RBL and a single read source line RSL associated with the selected column as shown in FIG. 3. Consequently, the power dissipation is reducible compared to the known art.

Figure 7A:
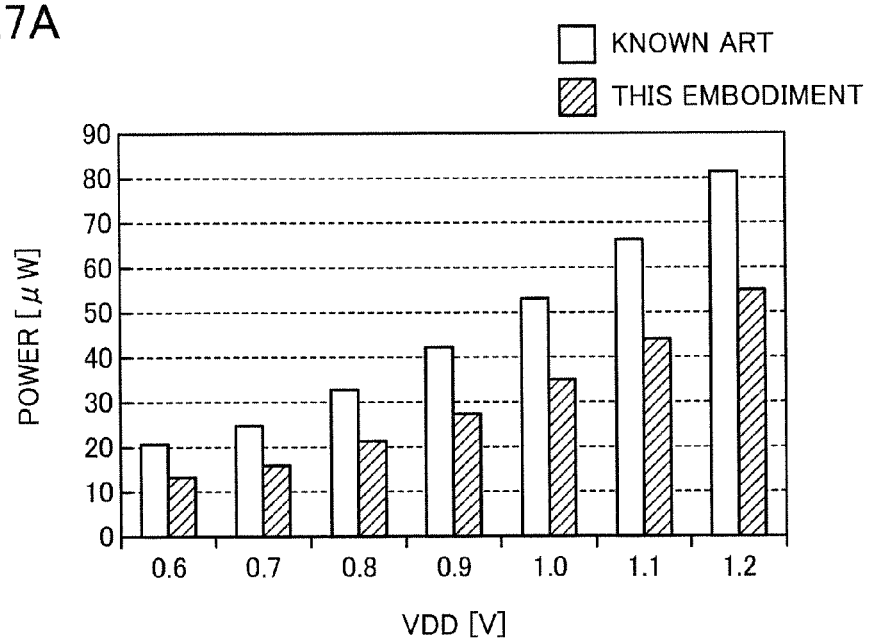
FIGS. 7A and 7B are graphs showing a relationship between the power supply potential and the power dissipation.
Figure 7B:
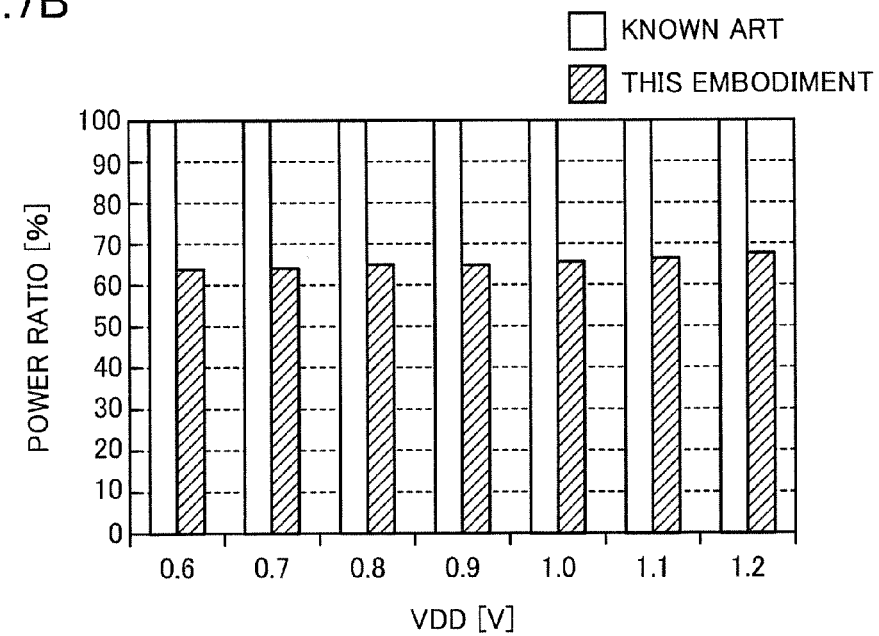

FIGS. 7A and 7B are graphs showing a relationship between the power supply potential and the power dissipation. More specifically, the power dissipated by the conventional configuration, and the one dissipated by the configuration shown in FIG. 1, during a read operation were estimated by SPICE (Simulation Program with Integrated Circuit Emphasis) simulation, for example, and are shown in FIGS. 7A and 7B in comparison with each other. In FIGS. 7A and 7B, in both cases of this embodiment and the conventional configuration, a two-port 8T-SRAM macro comprised of 64 Rows×8 Columns×4 bits was used, and the external clock signal CLK had a frequency of 20 MHz.

FIG. 7A shows a relationship between the power supply potential VDD and the power dissipation. FIG. 7B shows the ratio of the power dissipated by this embodiment to the one dissipated by the conventional configuration with respect to each power supply potential VDD.

As can be seen from FIGS. 7A and 7B, according to this embodiment, the power dissipation could be cut down, for example, by about 36% when the power supply potential VDD was 0.6 V and by about 32% when the power supply potential VDD was 1.2 V, respectively, compared to the conventional configuration. Thus, this embodiment allows for cutting down the power dissipation over a broader range of power supply potentials VDD.

In this case, the load capacitance of the read bit line RBL is supposed to be approximately equal to that of the read source line RSL according to this embodiment. Also, if the number of columns of the SRAM macro (i.e., if the number of column multiplex) is N, the power dissipated by the read bit line RBL is reducible according to this embodiment to 2/N of the power dissipated by the conventional configuration.

Furthermore, supposing the ratio of the power dissipated by the read bit line RBL to the overall power dissipation by the SRAM macro is M, the overall power reduction ratio P_read achieved by the SRAM macro during a read operation may be represented by $$P\_read = M \times (1 - 2/N)$$

Therefore, if M=0.5 and N=8, for example, P_read according to this embodiment becomes $$P\_read = 0.5 \times (1 - 2/8) = 3/8 = 37.5\%$$

Thus, the overall power dissipation by the SRAM macro is reducible by 37.5%.

Figure 8A:
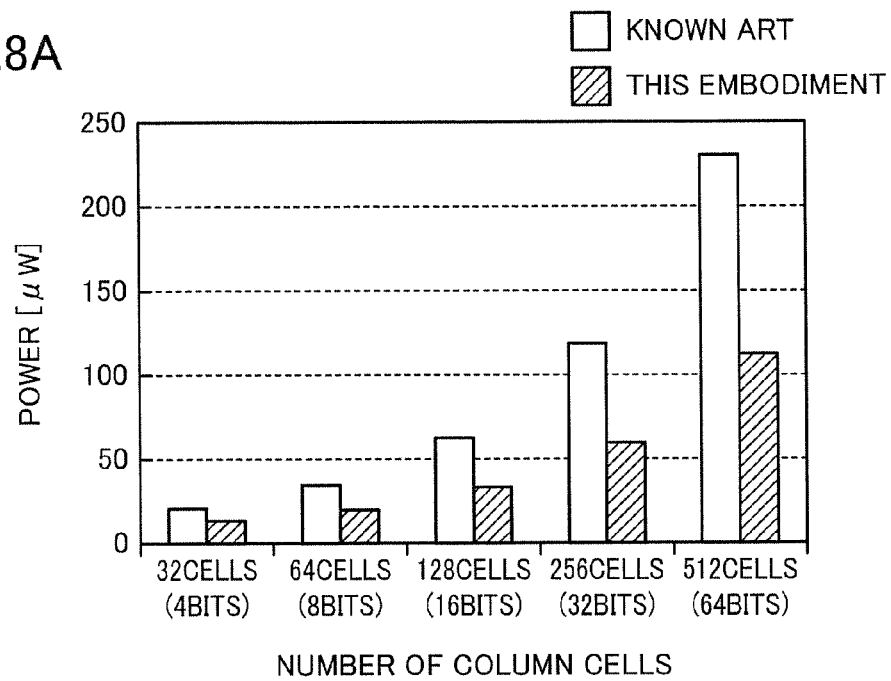
FIGS. 8A and 8B are graphs showing a relationship between the number of column cells and the power dissipation.
Figure 8B:
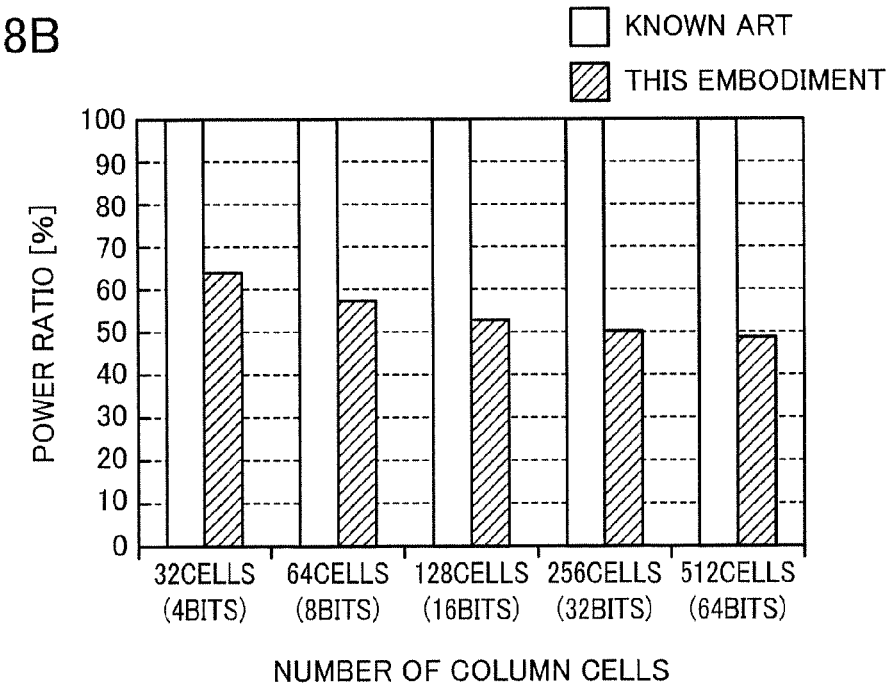
Figure 9A:
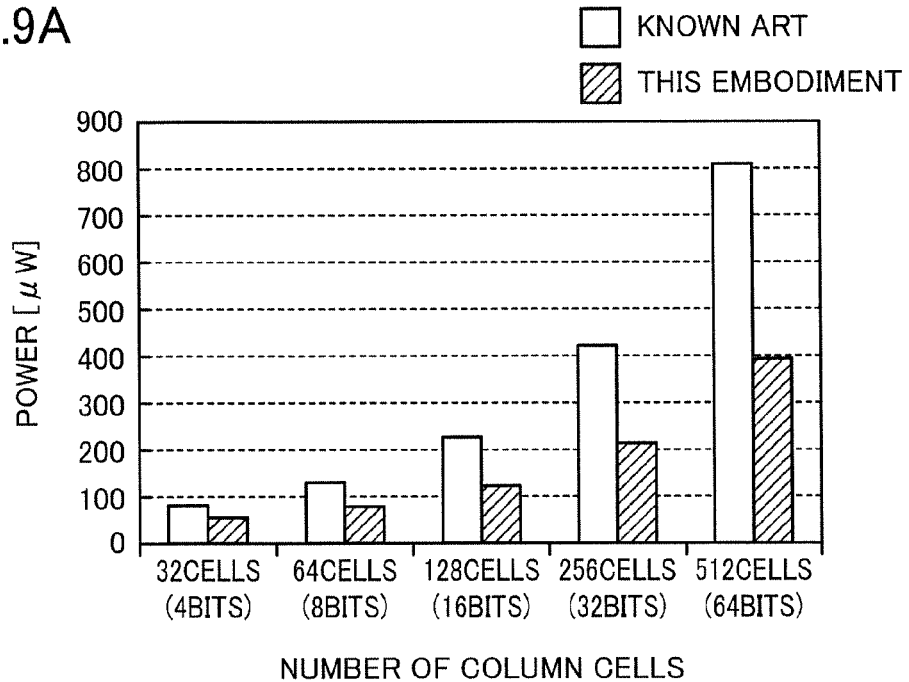
FIGS. 9A and 9B are other graphs showing a relationship between the number of column cells and the power dissipation.
Figure 9B:
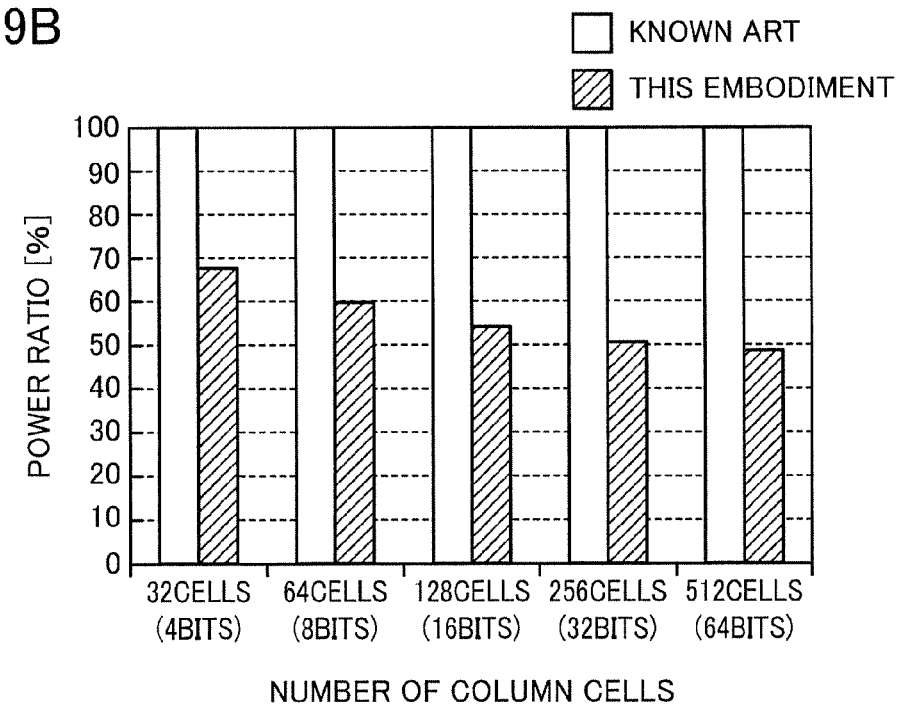

FIGS. 8A, 8B, 9A, and 9B are graphs each showing a relationship between the number of column cells and the power dissipation. Specifically, FIGS. 8A and 8B illustrate a situation where the power supply potential VDD is 0.6 V, and FIGS. 9A and 9B illustrate a situation where the power supply potential VDD is 1.2 V. In FIGS. 8A, 8B, 9A, and 9B, 1 bit of the SRAM macro is comprised of 64 Rows×8 Columns. Also, in the examples shown in FIGS. 8A, 8B, 9A and 9B, the external clock signal CLK had a frequency of 20 MHz and the SRAM macro had a normal temperature.

In FIGS. 8A, 8B, 9A and 9B, the number of column cells refers herein to the number of columns on a single read word line RWL. Thus, if the number of column cells is 32 cells, the SRAM macro is comprised of 4 bits. If the number of column cells is 64 cells, the SRAM macro is comprised of 8 bits. If the number of column cells is 128 cells, the SRAM macro is comprised of 16 bits. If the number of column cells is 256 cells, the SRAM macro is comprised of 32 bits. If the number of column cells is 512 cells, the SRAM macro is comprised of 64 bits. An increase in the number of column cells means an increase in the number of I/O bits.

FIGS. 8A and 9A are each a graph showing how the power dissipation changes with the number of column cells in the conventional configuration and in this embodiment. On the other hand, FIGS. 8B and 9B are each a graph showing the ratio of the power dissipated by this embodiment to the power dissipated by the conventional configuration with respect to each number of column cells. That is to say, FIGS. 8A, 8B, 9A and 9B show the dependence of the power dissipation on the number of column cells in the conventional configuration and in this embodiment.

As can be seen from FIGS. 8A, 8B, 9A and 9B, as the number of column cells increases, the power dissipation by the read bit line RBL accounts for an increasing percentage of the overall power dissipation by the SRAM macro. Among other things, the power dissipation by the read bit lines RBL associated with the non-selected columns comes to have more and more significant influence. That is why it can be said that according to the conventional configuration, the power for charging and discharging the read bit lines RBL associated with the non-selected columns has significant influence on the overall power dissipation by the SRAM macro.

Therefore, as the number of column cells increases, the power dissipation reduction ratio increases more significantly in this embodiment than in the conventional configuration. It can be seen that in FIGS. 8B and 9B, for example, when the number of column cells was 512 cells (64 bits), the power dissipation could be cut down by as much as about 52% according to this embodiment compared to the conventional configuration. Thus, this embodiment allows for cutting down the power dissipation over a broader range of power supply potentials VDD.

As can be seen from the foregoing description, a read source line RSL is provided according to this embodiment for each column of the memory cell array MCA. Therefore, the read source lines RSL are controllable during a read operation such that the read bit lines RBL and read source lines RSL associated with the non-selected columns are not discharged. As a result, the power to be dissipated during the read operation can be only the power for discharging and precharging the read bit line RBL and read source line RSL associated with the selected column. This thus allows for cutting down the power dissipation of even an SRAM with a large storage capacity. Particularly in an SRAM macro with a large number of I/O bits and a horizontally elongated configuration, the power dissipation is reducible significantly effectively.

Second Embodiment

FIG. 10 illustrates a configuration for a semiconductor memory device according to a second embodiment. The following description of this second embodiment will be focused on the difference between the second embodiment and the first embodiment.

The semiconductor memory device 1 of this embodiment includes keeper circuits KP <7:0>.

Each keeper circuit KP is provided for an associated read bit line RBL in order to maintain the potential on the associated read bit line RBL at a predetermined potential (e.g., at the power supply potential VDD). The keeper circuit KP may be comprised of an inverter INV4 and a PMOS transistor TR5, for example. The inverter INV4 has its input terminal connected to the associated read bit line RBL and has its output terminal connected to the gate of the transistor TR5. The transistor TR5 has its source connected to the power supply potential VDD and has its drain connected to the associated read bit line RBL.

As can be seen from the foregoing description, according to this embodiment, by connecting a keeper circuit KP to a read bit line RBL, even when this semiconductor memory device 1 comes to have a high temperature, for example, the potential on the read bit line RBL is prevented from decreasing due to leakage current that might flow from the transistors connected to the other read bit lines RBL associated with the non-selected columns, in particular. That is to say, this prevents a decrease in the potential on the read bit line RBL from causing feedthrough current to flow from the output of the read source line driver RSLD into the read bit line RBL, thus allowing for performing a read operation with good stability.

Note that the keeper circuit KP may have any other arbitrary configuration as long as the potential on the read bit line RBL can be maintained at a predetermined potential level.

Third Embodiment

Figure 11A:
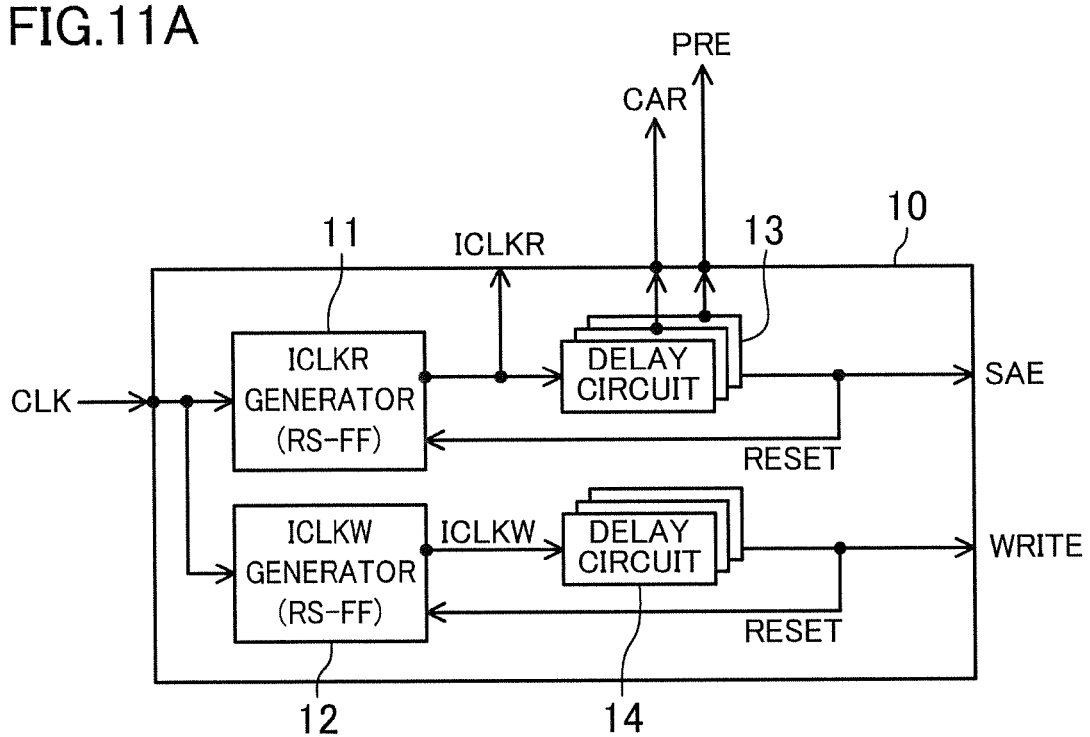
FIGS. 11A and 11B illustrate a configuration for a memory controller according to a third embodiment.
Figure 11B:
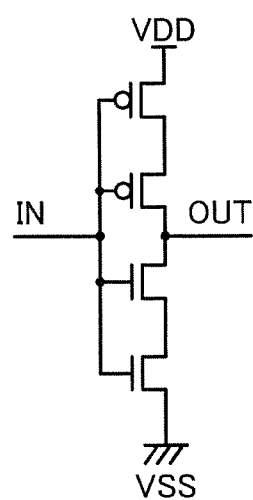

FIG. 11A illustrates a configuration for a memory controller according to a third embodiment. FIG. 11B illustrates a configuration for a delay circuit for use in the memory controller. The semiconductor memory device 1 of this embodiment may have the same configuration as any of the devices of the first and second embodiments.

The memory controller 10 shown in FIG. 11A includes an internal clock generator 11 for read operation (which will be hereinafter referred to as an "ICLKR generator 11"), an internal clock generator 12 for write operation (which will be hereinafter referred to as an "ICLKW generator 12"), and delay circuits 13, 14.

The ICLKR generator 11 generates an internal clock signal ICLKR, which is a clock signal for use in a read operation, based on an external clock signal CLK. On the other hand, the ICLKW generator 12 generates an internal clock signal ICLKW, which is a clock signal for use in a write operation, based on the external clock signal CLK.

The ICLKR and ICLKW generators 11 and 12 may each be configured as an RS flip-flop, for example.

The delay circuits 13 and 14 may each have a configuration such as the one shown in FIG. 11B. The delay circuit 13 causes delay to the internal clock signal ICLKR and generates and outputs a column select signal CAR and a precharge signal PRE. In this embodiment, the number of stages of the delay circuit 13 is adjusted such that the column select signal CAR is activated at an earlier timing than the precharge signal PRE is. Another output of the delay circuit 13 becomes a reset signal RESET for the ICLKR generator 11 and a signal SAE for an amplifier and other components.

The delay circuit 14 causes delay to the internal clock signal ICLKW and generates and outputs a reset signal RESET for the ICLKW generator 12 and a write signal WRITE.

In FIG. 11A, the number of stages of the delay circuits 13 and 14 may be determined arbitrarily, and the amount of delay to be caused to each of the internal clock signals ICLKR and ICLKW may be adjusted according to the number of stages of the delay circuits 13 and 14. For example, by setting the number of stages of the delay circuit 13 when generating the column select signal CAR to be different from the number when generating the precharge signal PRE, the timings of activation of these signals are adjustable arbitrarily.

Figure 12:
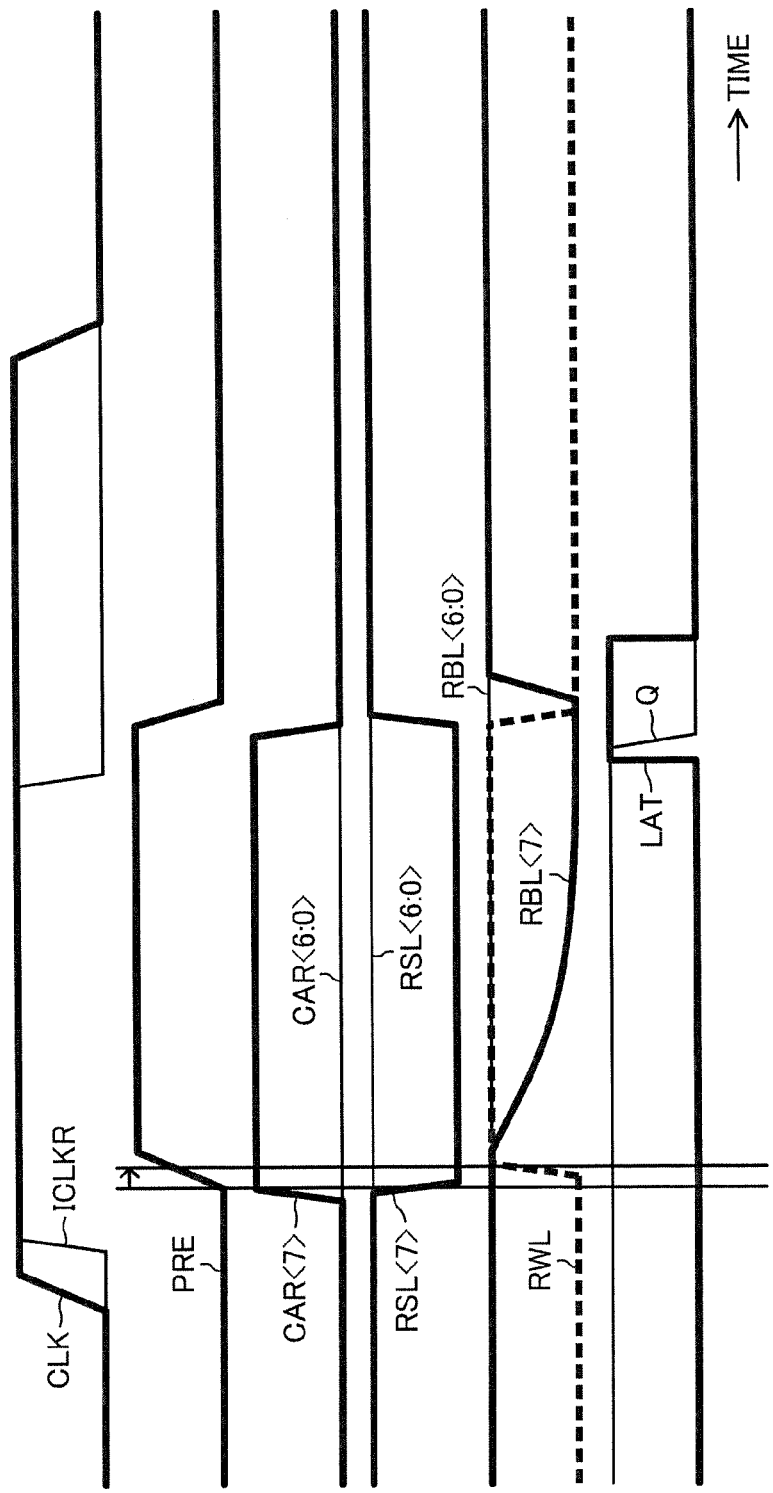
FIG. 12 is a waveform chart illustrating how the semiconductor memory device of the third embodiment performs a read operation.

FIG. 12 is a waveform chart illustrating how the semiconductor memory device of the third embodiment performs a read operation. The following description will be focused on the difference between FIGS. 12 and 3.

In FIG. 12, after the internal clock signal ICLKR has risen to the H level, the selected column signal CAR <7> rises to the H level, when the read source line RSL <7> starts to be discharged. Thereafter, after the precharge signal PRE has risen to the H level to stop precharging the read bit line RBL, the read word line RWL is driven to the H level.

If the semiconductor memory device 1 were configured as a memory cell array of a column source decoding type, the read bit lines RBL and read source lines RSL would be arranged physically in parallel with each other either horizontally or vertically due to layout restriction on the memory cells MC. That is why if these lines were driven simultaneously, coupling noise interference would occur, thus possibly causing instability in the amplitude voltage of the read bit lines RBL too much to perform a read operation with good stability.

On the other hand, by performing a read operation as shown in FIG. 12, the timing when the charge on the read source line RSL is discharged can be earlier than the timing when the precharge signal PRE rises to the H level (i.e., the timing when the read bit line RBL stops being precharged). According to this embodiment, the timings of activating these signals may be adjusted suitably, and therefore, a read operation may be performed with good stability with an increase in the overall circuit area of the semiconductor memory device 1 minimized and with the coupling noise interference reduced.

Fourth Embodiment

Figure 13:
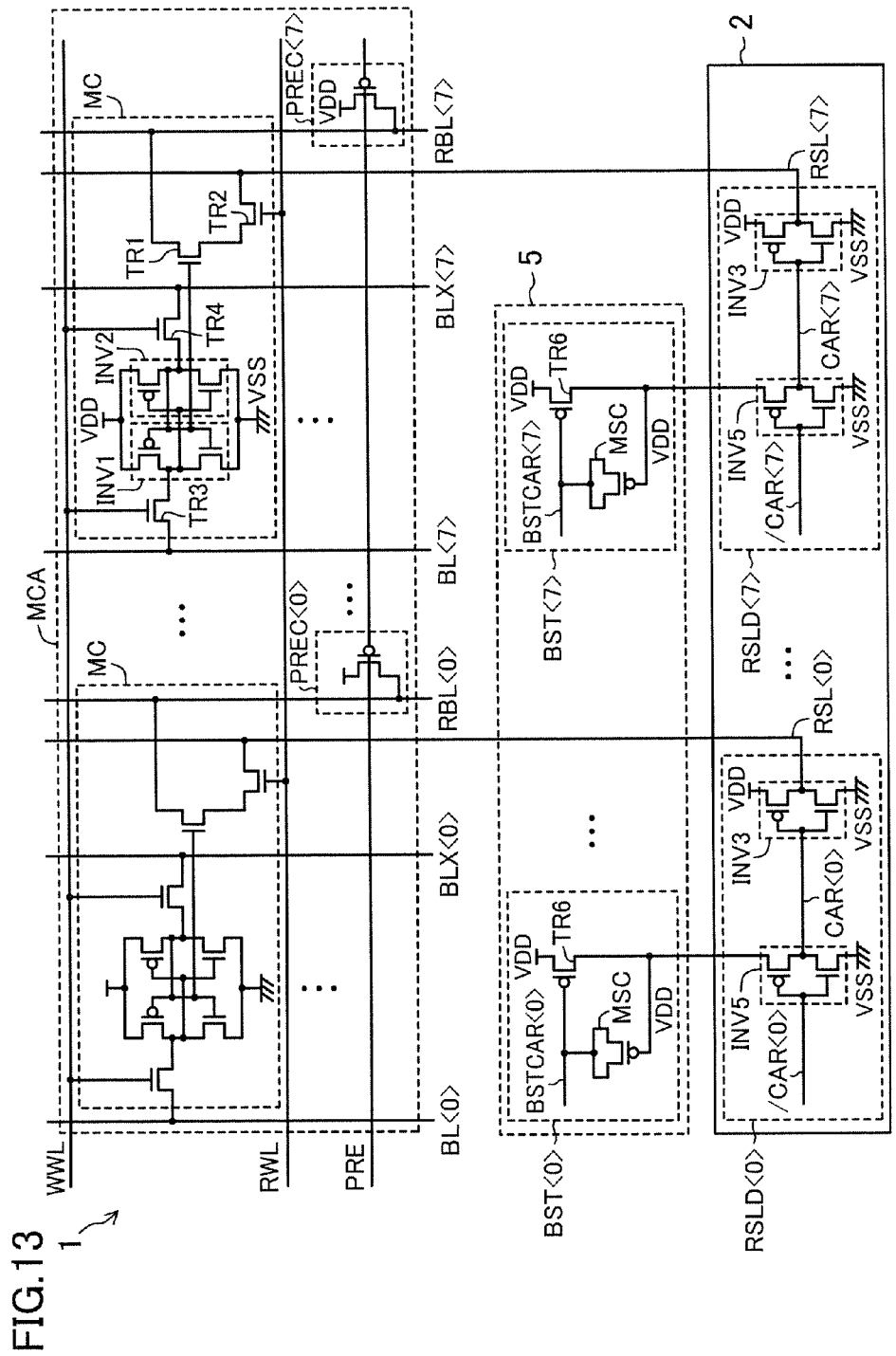
FIG. 13 illustrates a configuration for a semiconductor memory device according to a fourth embodiment.

FIG. 13 illustrates a configuration for a semiconductor memory device according to a fourth embodiment. The following description of this fourth embodiment will be focused on the difference between the fourth embodiment and the first embodiment. As shown in FIG. 13, this semiconductor memory device 1 includes a memory cell array MCA, a read source line driver section 2, and booster circuit section 5.

The read source line driver section 2 includes a plurality of read source line drivers RSLD <7:0>, each of which is associated with one of the plurality of source lines RSL.

Each read source line driver RSLD is comprised of two stages of inverters, e.g., inverters INV3 and INV5.

The inverter INV3 operates with the power supply potential VDD and has its input terminal connected to the output terminal of the inverter INV5 and its output terminal connected to the associated read source line RSL, respectively.

The inverter INV5 is configured to be operable with either the power supply potential VDD or a voltage VDDBST which is higher than the power supply potential VDD. The inverter INV5 receives its associated inverted column select signal/CAR <7:0> and outputs its associated column select signal CAR <7:0> to the inverter INV3.

The booster circuit section 5 includes booster circuits BST <7:0> which are provided for their associated read source line drivers RSLD.

Each booster circuit BST is configured to generate the voltage VDDBST higher than the power supply potential VDD. That is to say, VDDBST>VDD+α (where α>0) is satisfied.

The booster circuit BST may be comprised of a PMOS transistor TR6 and an MOS capacitive element MSC, for example. The transistor TR6 has its source connected to the power supply potential VDD and has its drain connected to the power supply potential of the inverter INV5 and to the gate of the MOS capacitive element MSC. Also, a boost column signal BSTCAR <7:0> associated with the booster circuit BST is applied to the gate of the transistor TR6 and to the MOS capacitive element MSC. As the MOS capacitive element, a PMOS capacitive element, an NMOS capacitive element, a Depletion MOS capacitive element or any other arbitrary capacitive element may be used. In this manner, by controlling the MOS capacitor with a pulse and raising its voltage, a boosted potential VDDBST may be generated based on only the power supply potential VDD.

By using booster circuits BST and read source line drivers RSLD with such configurations, the potential applied to the read source line driver RSLD associated with the selected column during a read operation can be higher than the potential applied to any other read source line driver RSLD.

Specifically, suppose, during a data read operation, a boost column signal BSTCAR (e.g., the boost column signal BST-CAR <7>) supplied to the booster circuit BST (e.g., the booster circuit BST <7>) associated with the selected column rises to the H level among a plurality of boost column signals BSTCAR. In that case, the potential applied to the associated read source line driver RSLD (e.g., the read source line driver RSLD <7>) is boosted from VDD to VDDBST.

Note that the booster circuit BST just needs to be configured to apply a higher potential than the power supply potential VDD to the source line driver RSLD associated with the selected column during a data read operation.

Figure 14:
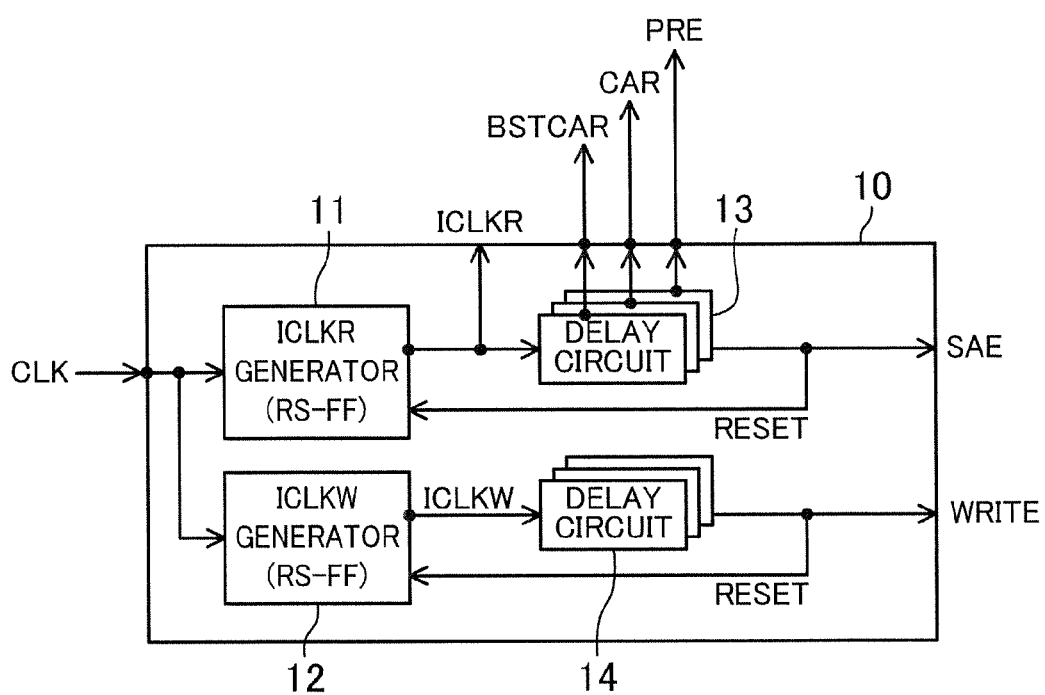
FIG. 14 illustrates a configuration for a memory controller according to the fourth embodiment.

FIG. 14 illustrates a configuration for a memory controller according to this fourth embodiment. The following description will be focused on the difference between FIGS. 14 and 11.

In the memory controller 10 of this embodiment, the delay circuit 13 causes delay to the internal clock signal ICLKR, thereby generating a boosted column signal BSTCAR. Note that the number of stages of the delay circuit 13 may be adjusted so as to activate each signal at an appropriate timing. Also, the boosted column signal BSTCAR may be subjected to a multiplex control on a selected column basis, or may even be a non-column-multiplexed control signal.

Figure 15:
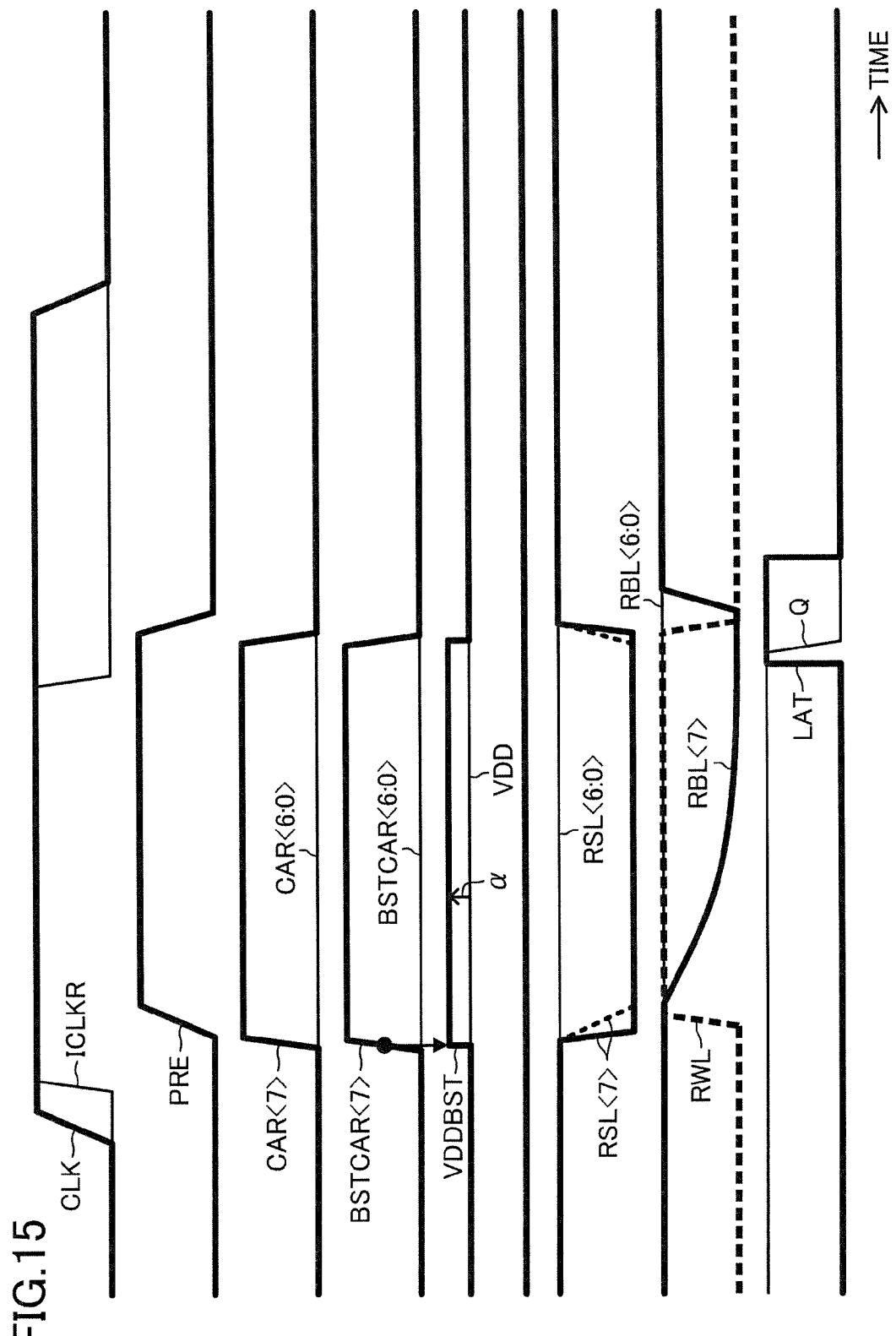
FIG. 15 is a waveform chart illustrating how the semiconductor memory device of the fourth embodiment performs a read operation.

Next, it will be described how the semiconductor memory device 1 of this embodiment performs a read operation. FIG. 15 is a waveform chart illustrating how the semiconductor memory device of this fourth embodiment performs a read operation. The following description will be focused on the difference between FIGS. 15 and 3.

When the internal clock signal ICLKR rises to the H level to assert the column boost signal BSTCAR <7>, for example, to the H level, the booster circuit BST <7> outputs a voltage VDDBST. In this case, during a read operation, the control is carried out such that the internal clock signal ICLKR remains high (H) for as long a period of time as the column boost signal BSTCAR <7> is. In this embodiment, the column boost signal BSTCAR is generated as shown in FIG. 13 in response to the internal clock signal ICLKR, and therefore, these pulse signals can remain H for the same period of time from that point in time.

While the column boost signal BSTCAR <7> remains H, the inverter INV5 of the read source line driver RSLD <7> operates with the voltage VDDBST. After that, the selected column signal CAR <7> rises to the H level. The H level at this point in time, i.e., the input voltage of the inverter INV3, is higher than the power supply potential VDD. Thus, the charge on the read source line RSL <7> is discharged by the inverter INV3 at a higher rate. In this manner, by performing a control operation such that the selected column signal RSL <7> rises to the H level after the operating voltage of the inverter INV5 has been boosted, the read source line RSL <7> is discharged in a shorter time. This thus allows for speeding up the read operation.

Meanwhile, since the column boost signal BSTCAR <6:0> remains low (L), the outputs of the booster circuits BST <6:0> are still equal to the power supply potential VDD.

In FIG. 15, the dashed line indicated by RSL <7> represents a waveform in a situation where the operating voltage of the read source line driver RSLD <7> is not boosted, and the solid line represents a waveform in a situation where the operating voltage of the read source line driver RSLD <7> is boosted.

As can be seen from the foregoing description, according to this embodiment, by boosting the potential applied to a read source line driver RSLD during a read operation period, its associated read source line RSL is readily discharged quickly, thus allowing for speeding up the read operation.

Figure 16:
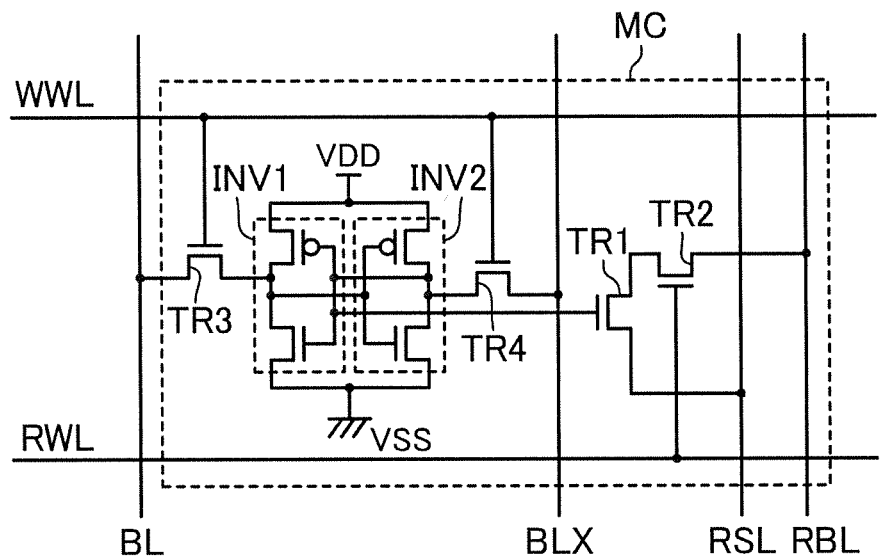
FIG. 16 illustrates a configuration for another memory cell according to the present disclosure.

In each of the embodiments described above, the memory cell MC may have a configuration such as the one shown in FIG. 16. Specifically, in this alternative configuration, the drain of the transistor TR1 is connected to the source of the transistor TR2. The source of the transistor TR1 is connected to a read source line RSL, and the drain of the transistor TR2 is connected to a read bit line RBL.

That is to say, in the memory cell MC according to each of the embodiments described above, the transistors TR1 and TR2 just need to be connected in series together between the read bit line RBL and the read source line RSL.

A semiconductor memory device according to the present disclosure allows for cutting down the power dissipation even if the number of memory cells to provide increases, and therefore, is useful for various types of electronic devices, of which the memories are going to have increasingly large storage capacities.

What is claimed is:

1. A semiconductor memory device having a memory cell array in which a plurality of memory cells are arranged in columns and rows to form a matrix pattern, the device comprising:

a plurality of read word lines, each of which is provided for an associated one of the rows of the memory cell array and connected in common to a plurality of memory cells that form the associated row;

a plurality of read bit lines, each of which is provided for an associated one of the columns of the memory cell array and connected in common to a plurality of memory cells that form the associated column; and a plurality of read source lines, each of which is provided for an associated one of the columns of the memory cell array and connected in common to a plurality of memory cells that form the associated column, wherein each of the plurality of memory cells includes:

first and second inverters which are cross-coupled to each other;

a first transistor which is connected between a read bit line and a read source line that are associated with the memory cell and of which the gate is connected to the output terminal of the first inverter; and a second transistor which is connected in series to the first transistor and of which the gate is connected to a read word line that is associated with the memory cell.

2. The semiconductor memory device of claim 1, wherein in each of the plurality of memory cells, the first transistor has its drain connected to a read bit line associated with the memory cell and has its source connected to the drain of the second transistor, and the second transistor has its source connected to a read source line associated with the memory cell.

3. The semiconductor memory device of claim 1, wherein in each of the plurality of memory cells, the first transistor has its source connected to a read source line associated with the memory cell and has its drain connected to the source of the second transistor, and the second transistor has its drain connected to a read bit line associated with the memory cell.

4. The semiconductor memory device of claim 1, further comprising:

a plurality of write bit lines, each of which is provided for an associated one of the columns of the memory cell array and connected in common to a plurality of memory cells that form the associated column; and a plurality of inverted write bit lines, each of which is provided for an associated one of the columns of the memory cell array and connected in common to a plurality of memory cells that form the associated column, wherein each of the plurality of memory cells includes:

a third transistor connected between a write bit line associated with the memory cell and the input terminal of the first inverter; and a fourth transistor connected between an inverted write bit line associated with the memory cell and the input terminal of the second inverter.

5. The semiconductor memory device of claim 1, wherein one of the plurality of read source lines which is associated with a selected one of the columns of the memory cell array is controlled to be active.

6. The semiconductor memory device of claim 5, wherein while data is being read from a selected one of the plurality of memory cells, a read source line associated with the selected column including the selected memory cell is connected to a ground potential, and the other read source lines are connected to the same potential as read bit lines associated with the non-selected columns other than the selected column.

7. The semiconductor memory device of claim 1, further comprising a plurality of keeper circuits, each of which is provided for an associated one of the plurality of read bit lines and which is configured to keep a potential on the associated read bit line a predetermined potential.

8. The semiconductor memory device of claim 7, wherein each of the plurality of keeper circuits includes:

a third inverter, of which the input terminal is connected to a read bit line associated with the keeper circuit; and a fifth transistor, of which the gate is connected to the output terminal of the third inverter, the source is connected to the predetermined potential, and the drain is connected to the read bit line associated with the keeper circuit.

9. The semiconductor memory device of claim 1, further comprising a plurality of driver circuits, each of which is provided for an associated one of the plurality of read source lines, wherein while data is being read from a selected one of the plurality of memory cells, a potential applied to a driver circuit which activates a read source line associated with a selected one of the columns of the memory cell array, including the selected memory cell, is controlled to be a predetermined potential which is higher than a potential applied to the other driver circuits.

10. The semiconductor memory device of claim 9, further comprising a plurality of booster circuits, each of which is provided for an associated one of the plurality of driver circuits and which has the ability to generate the predetermined potential, wherein each of the plurality of driver circuits includes:

a fourth inverter which operates using, as its power supply, output of one of the booster circuits that is associated with the driver circuit; and a fifth inverter, of which the input terminal is connected to the output terminal of the fourth inverter and the output terminal is connected to a read source line associated with the driver circuit.

11. The semiconductor memory device of claim 1, further comprising a plurality of precharge circuits, each of which is provided for an associated one of the plurality of read bit lines and which precharges the associated read bit line to a predetermined potential, wherein a timing for the plurality of precharge circuits to stop precharging is later than a timing when one of the plurality of read source lines that is associated with a selected column of the memory cell array is discharged.

* * * * *